United States Patent
Nishizawa et al.

(10) Patent No.: US 9,922,836 B2
(45) Date of Patent: Mar. 20, 2018

(54) SEMICONDUCTOR DEVICE MANUFACTURING METHOD AND SEMICONDUCTOR DEVICE

(71) Applicant: Mitsubishi Electric Corporation, Tokyo (JP)

(72) Inventors: Koichiro Nishizawa, Tokyo (JP); Akira Kiyoi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/320,183

(22) PCT Filed: Aug. 28, 2014

(86) PCT No.: PCT/JP2014/072528
§ 371 (c)(1),
(2) Date: Dec. 19, 2016

(87) PCT Pub. No.: WO2016/031004
PCT Pub. Date: Mar. 3, 2016

(65) Prior Publication Data
US 2017/0154777 A1  Jun. 1, 2017

(51) Int. Cl.
*H01L 21/44* (2006.01)
*H01L 21/288* (2006.01)
*H01L 21/768* (2006.01)

(52) U.S. Cl.
CPC ...... *H01L 21/288* (2013.01); *H01L 21/76883* (2013.01)

(58) Field of Classification Search
CPC ............... H01L 21/288; H01L 21/6723; H01L 21/76874; H01L 21/76883;
(Continued)

(56) References Cited

U.S. PATENT DOCUMENTS

| 6,221,788 B1 | 4/2001 | Kobayashi et al. |
| 2005/0097735 A1* | 5/2005 | Kanda ............ H05K 3/388 29/829 |

(Continued)

FOREIGN PATENT DOCUMENTS

| JP | H10-294296 A | 11/1998 |
| JP | 2005-336600 A | 12/2005 |

(Continued)

OTHER PUBLICATIONS

An Office Action issued by Taiwan Patent Office dated Jan. 4, 2017, which corresponds to Taiwanese patent application No. 105111603, which is the divisional patent application of the corresponding Taiwanese patent application No. 103136764, with partial English language translation.

(Continued)

*Primary Examiner* — Brook Kebede
(74) *Attorney, Agent, or Firm* — Studebacker & Brackett PC

(57) ABSTRACT

A semiconductor device manufacturing method of present application includes a catalytic step of depositing catalytic metal on a surface of a semiconductor substrate, an oxide removing step of removing oxide formed on the surface of the semiconductor substrate in the catalytic step, an additional catalytic step of depositing catalytic metal on the surface of the semiconductor substrate exposed in the oxide removing step, and a plating step of forming a metal film on the surface of the semiconductor substrate by means of an electroless plating method after the additional catalytic step.

10 Claims, 14 Drawing Sheets

(58) Field of Classification Search
CPC . H01L 2224/03825; H01L 2224/11464; H01L 2224/11825; H01L 2224/27464; H01L 2224/27825; H01L 2224/35125; H01L 2224/75189; H01L 2224/77181
USPC .......................................................... 438/678
See application file for complete search history.

(56) References Cited

U.S. PATENT DOCUMENTS

| | | | |
|---|---|---|---|
| 2010/0113264 A1* | 5/2010 | Tsurumi | C23C 18/30 502/402 |
| 2011/0117373 A1 | 5/2011 | Yae et al. | |
| 2015/0130028 A1* | 5/2015 | Asano | H01L 23/544 257/620 |

FOREIGN PATENT DOCUMENTS

| | | | |
|---|---|---|---|
| JP | 5261475 | B2 | 8/2013 |
| TW | 305058 | B | 5/1997 |

OTHER PUBLICATIONS

Notification of Transmittal of Translation of the International Preliminary Report on Patentability (Chapter I) and Translation of Written Opinion of the International Searching Authority; PCT/JP2014/072528; dated Mar. 9, 2017.

Yae et al., "Nucleation behavior in electroless displacement deposition of metals on silicon from hydrofluoric acid solutions" ELECTROCHIMICA Acta 53, 2007, pp. 35-41, ScienceDirect, Japan.

An Office Action issued by Taiwan Patent Office dated Jul. 29, 2016, which corresponds to Taiwanese Patent Application No. 105111603.

An Office Action issued by Taiwan Patent Office dated Jun. 7, 2017, which corresponds to Taiwanese patent application No. 105111603, which is the divisional patent application of the corresponding Taiwanese patent application No. 103136764, with partial English language translation.

* cited by examiner

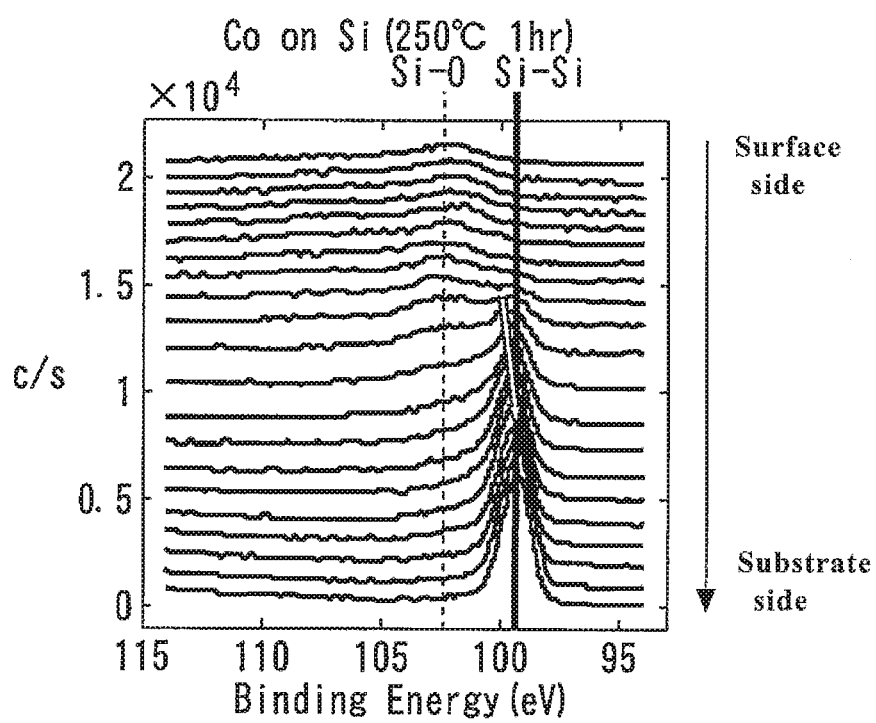

SEMICONDUCTOR DEVICE MANUFACTURING METHOD AND SEMICONDUCTOR DEVICE

TECHNICAL FIELD

The present invention relates to a semiconductor device manufacturing method in which a metal film used in an electrode or the like is formed by an electroless plating method and a semiconductor device manufactured by the method.

BACKGROUND

When an electroless plating step is to be applied to a semiconductor substrate, a catalytic metal must be formed on the semiconductor substrate in advance.

Patent Literature 1 discloses that a semiconductor substrate is dipped in a catalytic metal solution containing 0.2 [ppm] or less of dissolved oxygen to deposit catalytic metal while suppressing oxidation on a semiconductor substrate surface.

Patent Literature 2 discloses that a silicon substrate is dipped in a catalytic metal solution containing hydrofluoric acid and ammonium fluoride to deposit catalytic metal while removing an oxide on the surface.

Patent Literature 3 discloses that catalytic metal is formed in a non-through hole of a silicon substrate to form an electroless plating film (metal film) having good adhesion.

PRIOR ART

Patent Literature

Patent Literature 1: Japanese Patent Laid-Open No. H10-294296

Patent Literature 2: Japanese Patent Laid-Open No. 2005-336600

Patent Literature 3: Japanese Patent No. 5261475

SUMMARY

Technical Problem

When catalytic metal is given to a semiconductor substrate, a reduction reaction occurring when metal ions change into metal may oxidize a semiconductor substrate surface. The generated oxide prevents a sufficient amount of catalytic metal from being given to the semiconductor substrate or deteriorates the adhesion of a plating film.

According to the method disclosed in Patent Literature 1, since a dissolved oxygen of a catalytic metal solution is reduced, oxidation of a semiconductor substrate caused by oxygen in the catalytic metal solution can be suppressed. However, since an oxidation phenomenon of the semiconductor substrate with reduction deposition of catalytic metal is not related to the dissolved oxygen in the catalytic metal solution, the phenomenon cannot be suppressed. Thus, in the method disclosed in Patent Literature 1, an oxide cannot be suppressed from being generated.

According to the method disclosed in Patent Literature 2, an oxide can be removed while a semiconductor substrate is dipped in a catalytic metal solution, an amount of oxide on a semiconductor substrate surface can be reduced. However, in use of a catalytic metal solution containing a hydrofluoric-acid-based solution, a sufficient amount of catalytic metal cannot be given to the semiconductor substrate. Thus, in the method disclosed in Patent Literature 2, a plating film has poor in-plane uniformity, abnormal morphology occurs, and a plating layer is partially unformed disadvantageously.

In the method disclosed in Patent Literature 3, since a semiconductor substrate is dipped in a catalytic metal solution containing fluoride ions, a sufficient amount of catalytic metal cannot be given to the semiconductor substrate disadvantageously.

The present invention has been made to solve the above problems, and has as its object to provide a semiconductor device manufacturing method which gives a sufficient amount of catalytic metal to a semiconductor substrate and can form a preferred metal film by means of an electroless plating method and a semiconductor device formed thereby.

Means for Solving the Problems

A semiconductor device manufacturing method according to the present application includes a catalytic step of depositing catalytic metal on a surface of a semiconductor substrate, an oxide removing step of removing oxide formed on the surface of the semiconductor substrate in the catalytic step, an additional catalytic step of depositing catalytic metal on the surface of the semiconductor substrate exposed in the oxide removing step, and a plating step of forming a metal film on the surface of the semiconductor substrate by means of an electroless plating method after the additional catalytic step.

A semiconductor device according to the present application includes a semiconductor substrate, catalytic metal formed on the semiconductor substrate, and a metal film made of metal or alloy and formed on the catalytic metal, wherein the catalytic metal has a thickness of 1 to 200 nm, and the catalytic metal and an interface between the catalytic metal and the semiconductor substrate contain 1 to 10 atom % of oxygen.

Other characteristics of the present invention will be described below.

Advantageous Effects of Invention

According to the present invention, catalytic metal is deposited on a semiconductor substrate, thereafter, an oxide is removed, and catalytic metal is deposited on the semiconductor substrate again. For this reason, a sufficient amount of catalytic metal can be given to the semiconductor substrate.

BRIEF DESCRIPTION OF THE DRAWINGS

FIG. 21 is a diagram showing an XPS spectrum after Co deposition.

FIG. 22 is a table showing whether solid solutions can be formed with respect to combinations of various semiconductor substrates and various catalytic metals.

DESCRIPTION OF THE EMBODIMENTS

Figure 1:
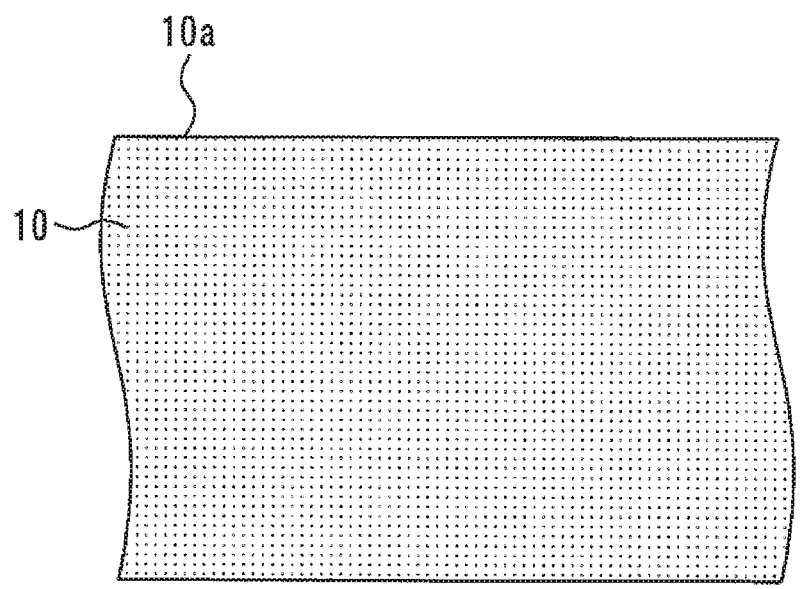
FIG. 1 is a sectional view of a semiconductor substrate.

A semiconductor device manufacturing method and a semiconductor device according to an embodiment of the present invention will be described below with reference to the accompanying drawings. The same reference symbols as in the drawings denote the same or corresponding constituent elements in the drawings, and repetitive descriptions may not be given.

Embodiment 1

A method of manufacturing a semiconductor device according to Embodiment 1 of the present invention, roughly, gives catalytic metal to the upper part of a semiconductor substrate and, thereafter, forms a metal film by means of an electroless plating method. With reference to FIG. 1 to FIG. 5, a semiconductor device manufacturing method according to Embodiment 1 of the present invention will be described below. FIG. 1 is a sectional view of a semiconductor substrate 10. First, an upper surface 10a of the semiconductor substrate 10 is subjected to chemical treatment or the like to remove foreign matter, an oxide, organic residual, and the like. FIG. 1 shows the semiconductor substrate 10 which has been cleaned.

In order to give catalyst to the surface of the semiconductor substrate, the semiconductor substrate is dipped in a catalytic metal solution. This step is called a catalytic step. In the catalytic step, a catalytic metal such as palladium, gold, silver, platinum, copper, nickel, ruthenium, rhodium, iridium, or osmium having catalytic activity in regard to electroless plating deposition is used. Although the ion densities of catalytic metals change depending on types of the catalytic metals, palladium preferably has a density of 0.1 [mmol/L] to 2.0 [mmol/L]. Even though the ion density of the catalytic metal is excessively high or low, the adhesive of the plating film (metal film) deteriorates. The temperature of the catalytic metal solution preferably falls within the range of 10° C. to 50° C., and dipping time preferably falls within the range of 1 minute to 5 minutes. The catalytic step allows the catalytic metal to be deposited on the surface of the semiconductor substrate.

Figure 2:
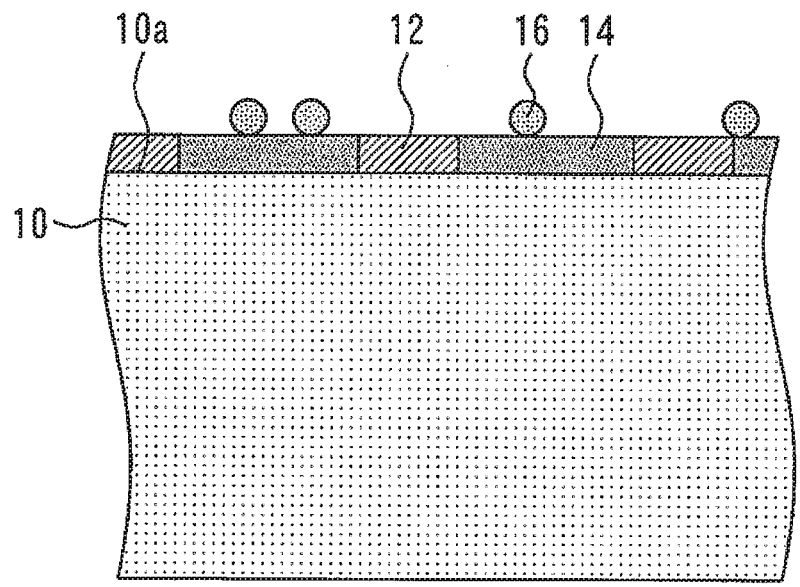
FIG. 2 is a sectional view of the semiconductor substrate obtained after the catalytic step.

FIG. 2 is a sectional view of the semiconductor substrate 10 obtained after the catalytic step. A catalytic metal 12 is formed on the semiconductor substrate 10. The catalytic metal 12 is distributed in the form of an island. The catalytic metal 12 is not given to some area of the upper surface 10a. An oxide 14 is formed on a part to which the catalytic metal 12 is not given. A catalytic metal 16 is present on the oxide 14.

Subsequently, the oxide 14 is removed. This step is called an oxide removing step. The oxide 14 may be removed by a wet process or may be removed by a dry process. When the oxide 14 is to be removed by the wet process, the semiconductor substrate is dipped in a hydrofluoric-acid-based solution. For example, a concentrate solution of hydrochloric acid, sulfuric acid, phosphoric acid, tartaric acid, or nitric acid, a diluted chemical solution thereof, or pure water may be used instead of hydrofluoric-acid-based solution. When the material of the semiconductor substrate is silicon, the semiconductor substrate is dipped in a hydrofluoric-acid-based solution diluted to, for example, a dilution rate of 30 for 2 minutes to make it possible to remove the oxide. When the material of the semiconductor substrate is GaAs, even though the semiconductor substrate is dipped in a hydrochloric acid solution having, for example, a dilution rate of 20 for 5 minutes or dipped in pure water, the oxide can be removed.

When the oxide 14 is to be removed by the dry process, plasma of an inert gas such as argon is applied to a semiconductor substrate surface to physically etch the oxide 14. Alternatively, sulfur hexafluoride (SF6), carbon tetrafluoride (CF4), or the like may be mixed in the plasma as a reactive ion gas to perform etching with a chemical reaction.

Figure 3:
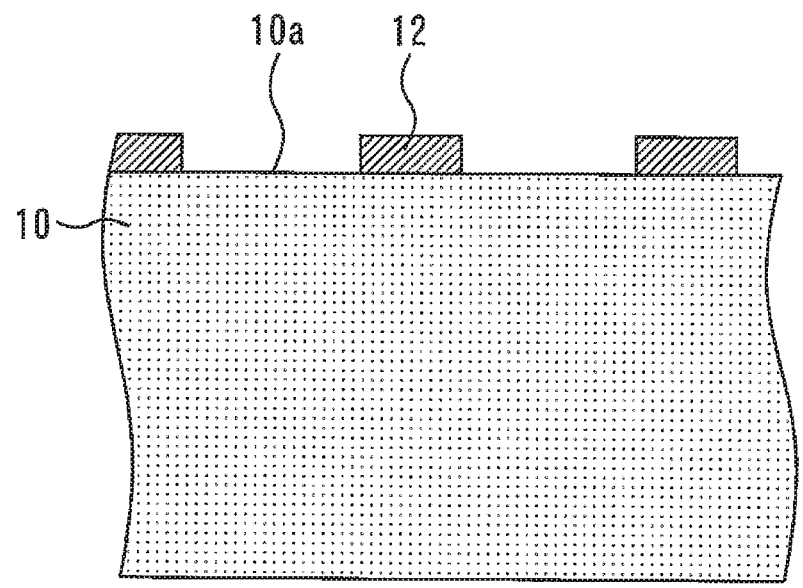
FIG. 3 is a sectional view of the semiconductor substrate obtained after the oxide removing step.

FIG. 3 is a sectional view of the semiconductor substrate 10 obtained after the oxide removing step. The oxide removing step allows the oxide 14 formed on the surface of the semiconductor substrate 10 in the catalytic step to be removed to partially expose the upper surface 10a of the semiconductor substrate 10.

Figure 4:
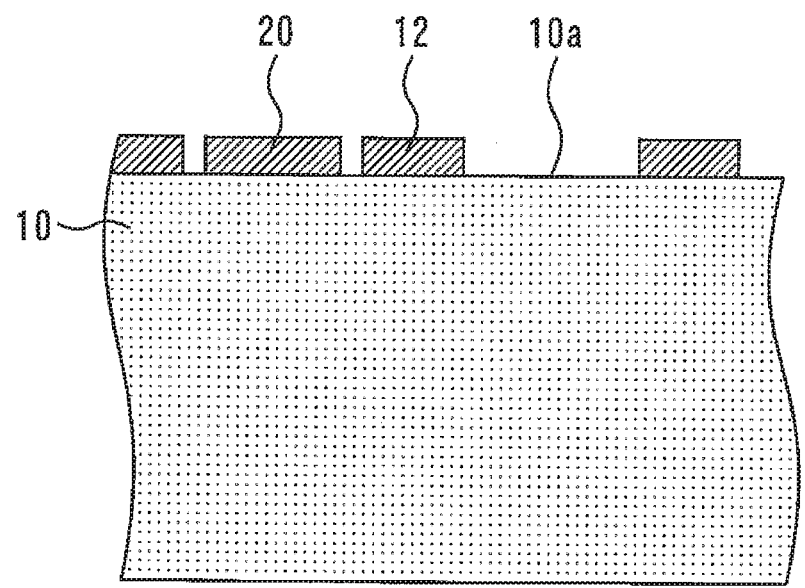
FIG. 4 is a sectional view of the semiconductor substrate obtained after the additional catalytic step.

Subsequently, a catalytic metal is given to the upper surface 10a of the semiconductor substrate 10 again. More specifically, the catalytic metal is deposited on the upper surface 10a of the semiconductor substrate 10 exposed in the oxide removing step. This step is called an additional catalytic step. The processing contents of the additional catalytic step are the same as those of the catalytic step described above. FIG. 4 is a sectional view of the semiconductor substrate 10 obtained after the additional catalytic step. The additional catalytic step allows a new catalytic metal 20 to be formed.

Figure 5:
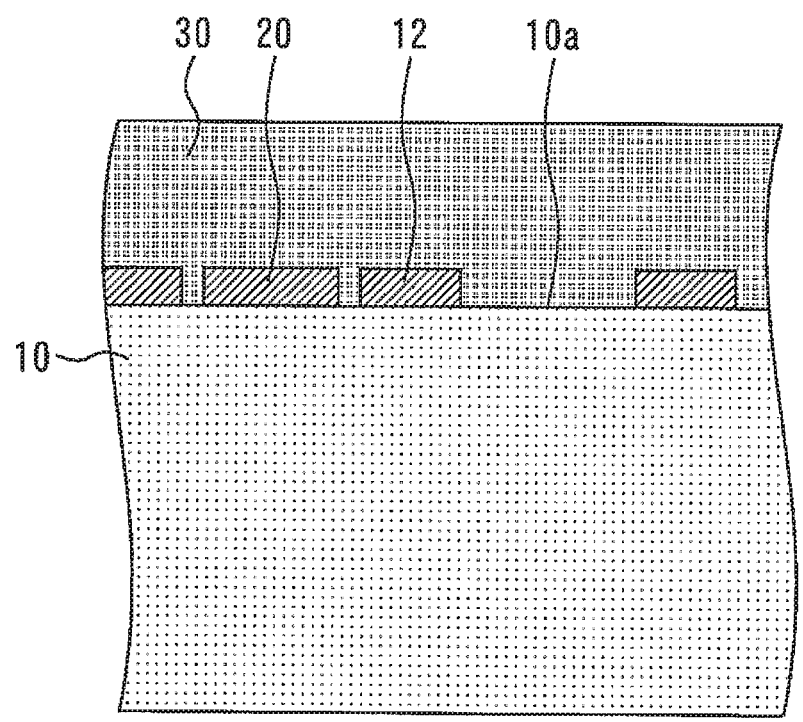
FIG. 5 is a sectional view of the semiconductor substrate obtained after the plating step.

After the additional catalytic step, a metal film is formed on the surface of the semiconductor substrate by means of an electroless plating method. This step is called a plating step. In the plating step, palladium, gold, silver, platinum, copper, nickel, tin, ruthenium, rhodium, iridium, an alloy obtained by mixing these metals, an alloy obtained by mixing any one of the metals with any one of boron, phosphorous, and tungsten, or the like is formed on the surface of the semiconductor substrate by means of an electroless plating method. FIG. 5 is a sectional view of the semiconductor substrate 10 obtained after the plating step. A metal film 30 is formed on the catalytic metals 12 and 20 with a metal or an alloy. The metal film 30 formed on the surface of the semiconductor substrate 10 in the way described above is used as, for example, an electrode of the semiconductor device. The semiconductor device manufacturing method according to Embodiment 1 of the present invention includes the steps described above.

According to the semiconductor device manufacturing method according to Embodiment 1, since the oxide 14 on the semiconductor substrate 10 is removed in the oxide removing step, adhesion of the catalytic metals 12 and 20 and the metal film 30 to the semiconductor substrate 10 can be improved. Oxygen contents in the catalytic metals 12 and 20 (layer on which the catalytic metals are formed) and interfaces between the catalytic metals 12 and 20 and the semiconductor substrate 10 are preferably 1 to 10 [atom %]. In order to obtain an effect in which oxygen is bonded to the catalytic metal and stabilized to suppress diffusion of the catalytic metal into the semiconductor substrate, the oxygen contents are set to 1 [atom %] or more. The oxygen contents are set to 10 [atom %] or less to improve the adhesion of the catalytic metal and the plating film to the semiconductor substrate. The processing time of each of the steps is optimized to make it possible to set the oxygen content to 1 to 10 [atom %].

The surface of the semiconductor substrate obtained immediately after the oxide removing step has reactivity (activity) higher than and a difference of levels of an uneven part (surface area larger) larger than those of the surface of the semiconductor substrate obtained immediately after the catalytic step. For this reason, the additional catalytic step is performed after the oxide removing step to make it possible to deposit a sufficient amount of catalytic metal on the surface of the semiconductor substrate. More specifically, in the additional catalytic step, the catalytic metal can be given to the part to which no catalytic metal is given in the catalytic step. Thus, since the catalytic metal can be uniformly formed on the semiconductor substrate, a plating layer is stably grown, and the uniform metal film 30 having good morphology and being free from an ungrown part can be formed.

The catalytic metals 12 and 20 preferably have film thicknesses of 1 to 200 [nm]. When the catalytic metal thickness is smaller than 1 [nm], electroless plating growth is not stably performed. When the thickness is larger than 200 [nm], adhesion of the metal film 30 to the semiconductor substrate 10 cannot be secured. When the catalytic metals 12 and 20 having film thicknesses of 1 to 200 [mm] are formed in a semiconductor substrate plane without fluctuation, even though the thicknesses of the catalytic metals fluctuate or the catalytic metals are present in the forms of islands, metal films having high adhesion can be stably formed.

Figure 6:
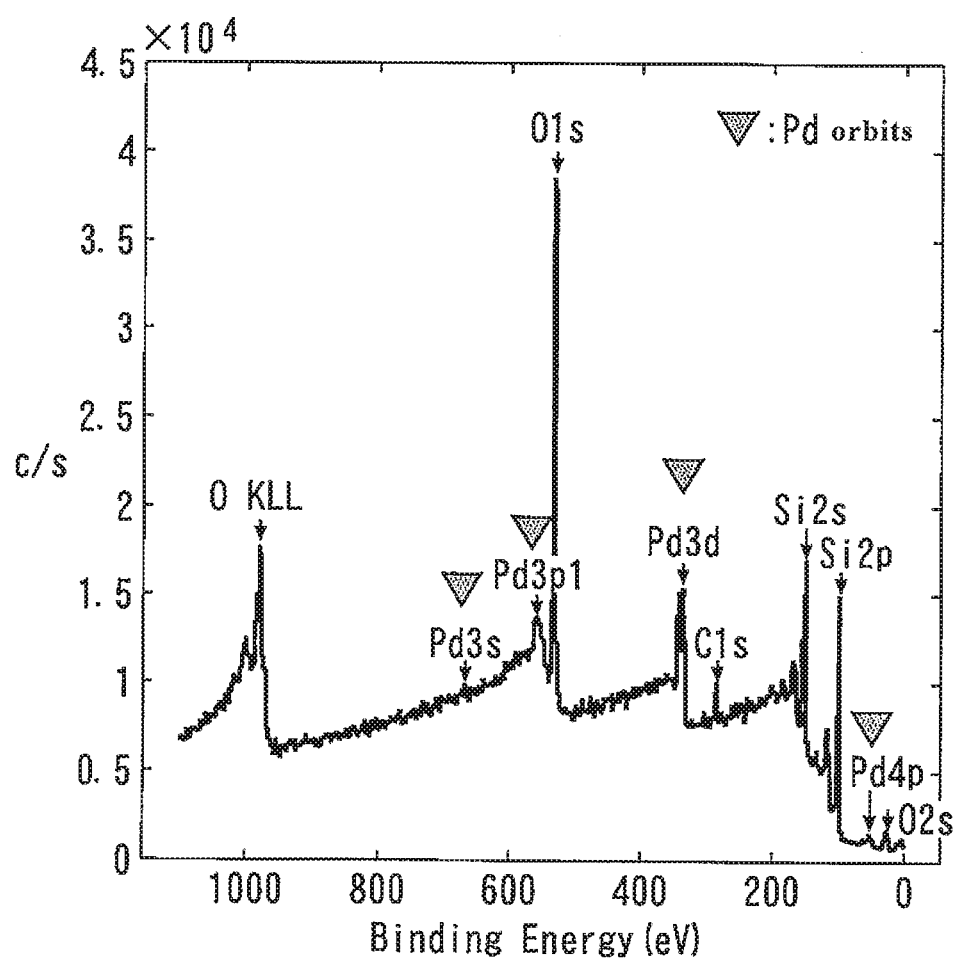
FIG. 6 is a diagram showing an XPS spectrum.
Figure 7:
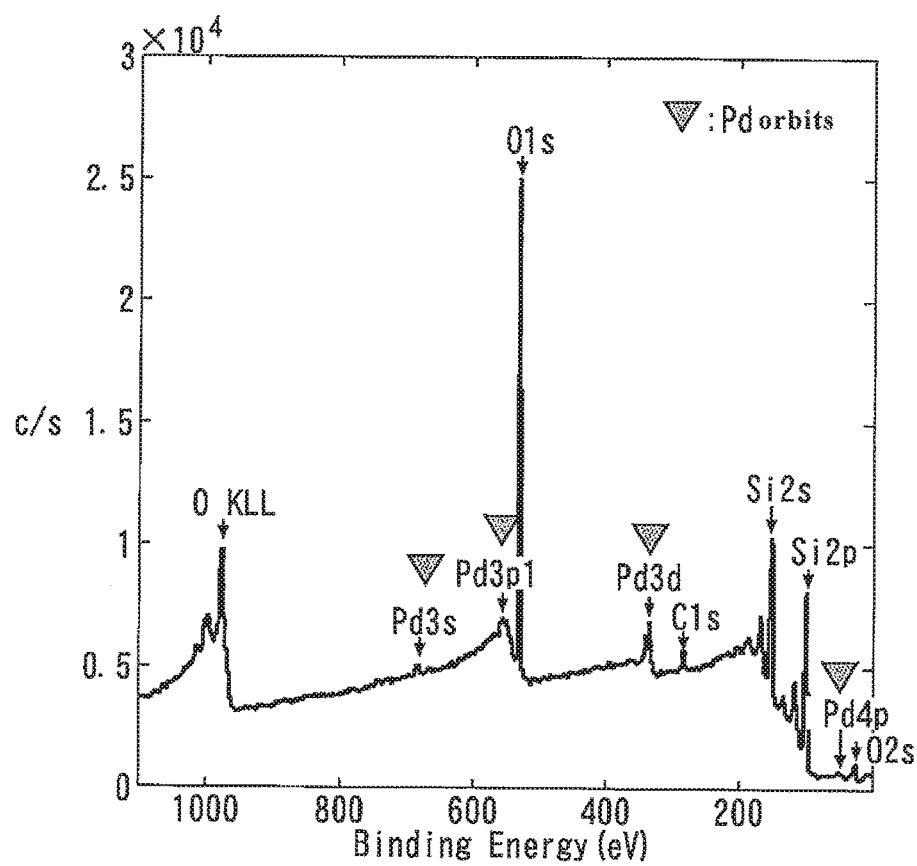
FIG. 7 is a diagram showing an XPS spectrum.

FIG. 6 shows an XPS spectrum of a silicon substrate to which a catalytic metal is given by a catalytic metal solution being free from a hydrofluoric-acid-based solution. The catalytic metal solution being free from hydrofluoric-acid-based solution is, more specifically, a catalytic metal solution prepared such that a palladium ion has a density of 0.9 [mmol/L]. FIG. 7 is an XPS spectrum of a silicon substrate to which a catalytic metal is given by a catalytic metal solution containing a hydrofluoric-acid-based solution. The catalytic metal solution containing the hydrofluoric-acid-based solution is, more specifically, a catalytic metal solution prepared to contain 5 [w %] of hydrofluoric acid, 21 [w %] of ammonium fluoride, 0.9 [mmol/L] of palladium ion.

In comparison between FIGS. 6 and 7, it is understood that an amount of catalytic metal which can be deposited is larger when the catalytic metal solution being free from a hydrofluoric-acid-based solution is used than when the catalytic metal solution containing a hydrofluoric-acid-based solution is used. A palladium composition ratio in the case in FIG. 6 was 2.5 [atom %], and the palladium composition ratio in the case in FIG. 7 was 1.1 [atom %]. When the palladium composition ratio is about 1.1 [atom %], a metal film is grown in the form of an island to form an ungrown part. More specifically, morphology becomes poor. In this manner, when the catalytic metal solution used in the catalytic step and the additional catalytic step contains a hydrofluoric-acid-based solution, an amount of deposited catalytic metal becomes insufficient. Thus, in the catalytic step and the additional catalytic step, the semiconductor substrate is preferably dipped in the catalytic metal solution being free from a hydrofluoric-acid-based solution.

The semiconductor device manufacturing method according to Embodiment 1 of the present invention can be variously modified. For example, before a plating step, a step of removing an oxide formed on the surface of the semiconductor substrate in the additional catalytic step may be set. The oxide is removed immediately before the plating step to make it easy to set the oxygen content to 1 to 10 [atom %].

A water-washing step may be set between the steps. A water-washing method is preferably performed for 10 seconds to 10 minutes by, for example, overflow or quick dump. These modifications can also be arbitrarily applied to a semiconductor device manufacturing method and a semiconductor device according to the following embodiment. Since the semiconductor device manufacturing method and the semiconductor device according to the following embodiment and those of Embodiment 1 are common in many points, different points between Embodiment 1 and the following embodiment will be mainly described below.

Embodiment 2

Figure 8:
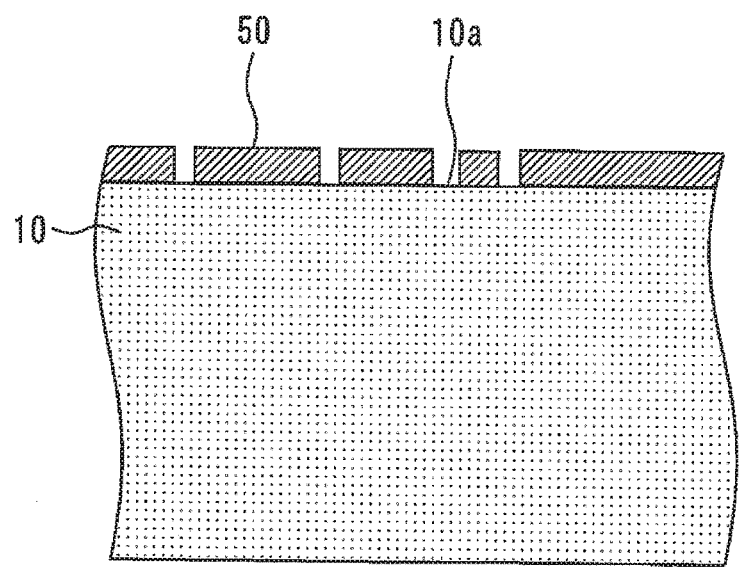
FIG. 8 is a sectional view of the semiconductor substrate obtained after the additional process.
Figure 9:
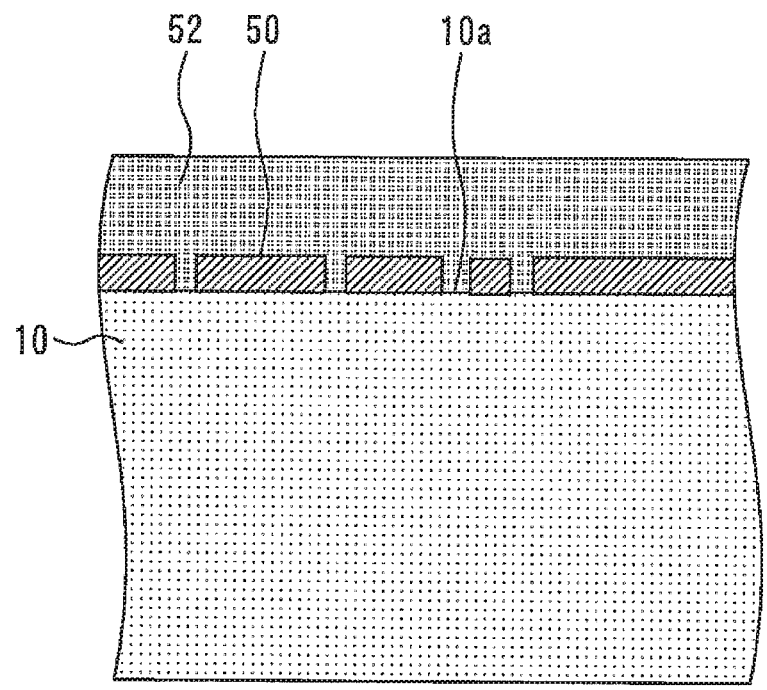
FIG. 9 is a sectional view of the semiconductor substrate obtained after metal film formation.

In a semiconductor device manufacturing method according to Embodiment 2 of the present invention, after the additional catalytic step, before the plating step, an additional process is performed once or more. The additional process is a step of removing an oxide on the surface of a semiconductor substrate to deposit a catalytic metal on the surface of the semiconductor substrate thereafter. In the additional process, the oxide is removed by the same method as that in the oxide removing step, and catalytic metal is deposited by the same method as that in the catalytic step. FIG. 8 is a sectional view of the semiconductor substrate obtained after the additional process. The additional process is performed to make it possible to deposit a large amount of catalytic metal 50. After the additional process, the plating step is started, as shown in FIG. 9, a metal film 52 is formed.

When the oxide is removed in the additional process, the surface of the semiconductor substrate includes a part to which the catalytic metal is given and a part where the surface is exposed (exposed part). Thereafter, in order to deposit catalytic metal on the exposed part, both the catalytic metal and the oxide are formed on the exposed part. For this reason, the additional process is performed once or more to make it possible to give a large amount of catalytic metal. When the number of times of the additional process is increased, the amount of oxide decreases, and an amount of catalytic metal gradually increases. However, when the number of times of the additional process is excessively large, new catalytic metal is deposited on the existing catalytic metal to deteriorate the uniformity of a catalytic metal thickness, and the number of times must be appropriately selected.

Figure 10:
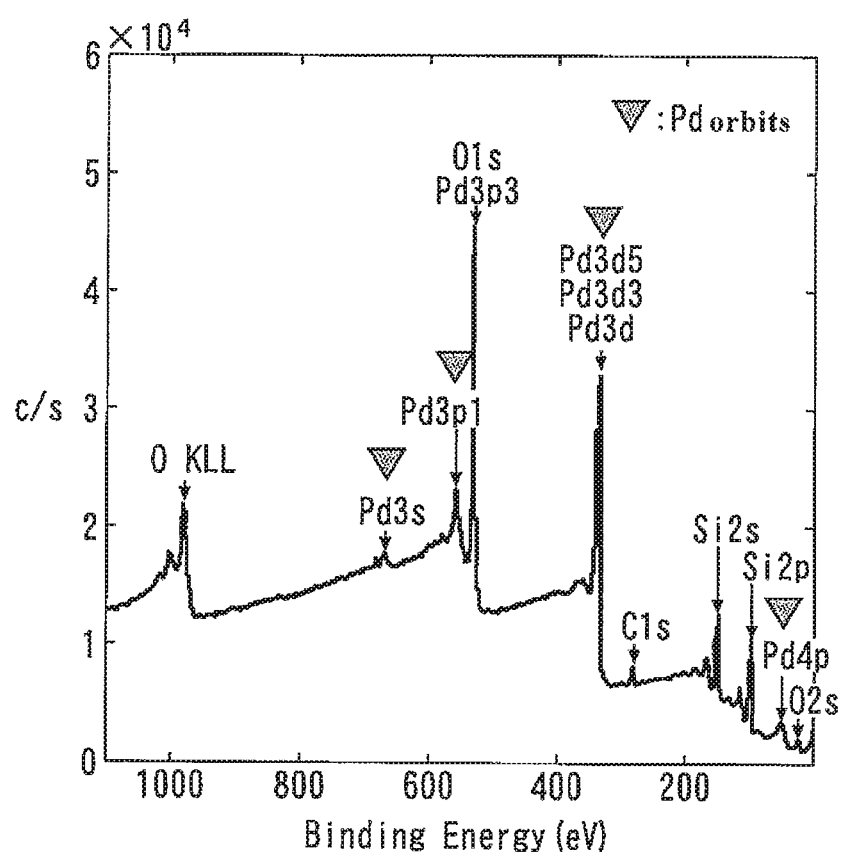
FIG. 10 is a diagram showing an XPS spectrum.

FIG. 10 is an XPS spectrum of a silicon substrate surface to which the same processes as those in the oxide removing step are subjected after the additional process is performed twice. In formation of the sample, palladium ions in a catalytic metal solution are prepared to have a density of 0.9 [mmol/L]. In removal of an oxide, a solution mixture of hydrogen fluoride and ammonium fluoride was used, and a water-washing step using pure water is set between the steps. The applied solutions are stored in the air, and a dissolved oxygen removing step is not performed.

Figure 11:
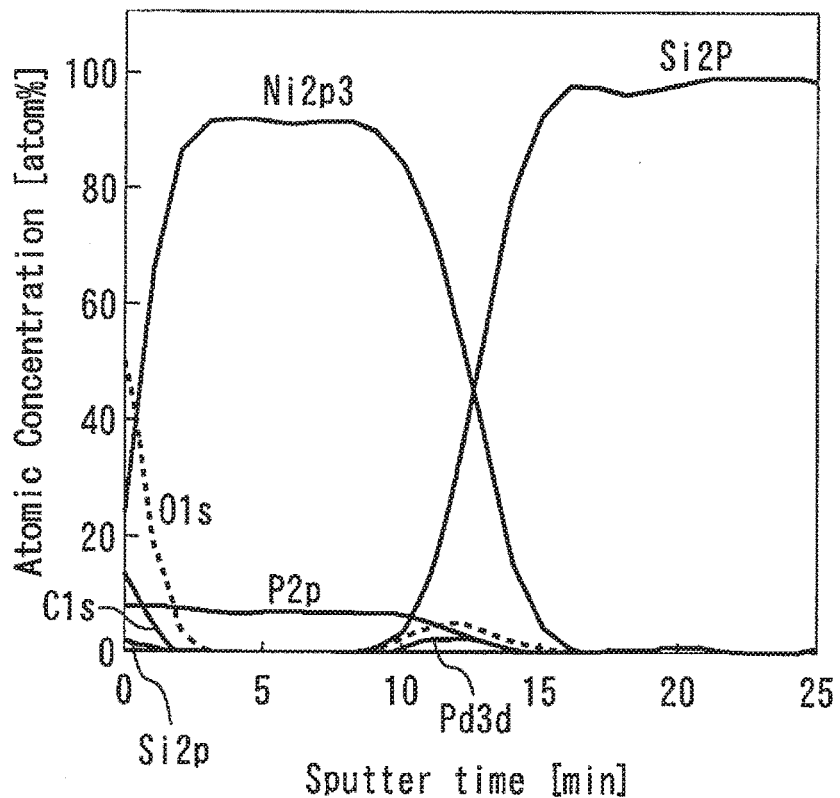
FIG. 11 is a diagram showing a result of depth XPS.

When a waveform in FIG. 10 is compared with a waveform obtained when the additional process is not performed in FIG. 6, it is understood that the amount of deposited palladium is increased by performing the additional process. In the case in FIG. 10, since a palladium composition ratio is 7.5 [atom %], it is understood that a large amount of palladium is deposited. Electroless nickel plating was performed to the sample to make it possible to form a metal film having preferable morphology and high adhesion. FIG. 11 shows a result of depth XPS with respect to the sample obtained after an electroless nickel plating layer is formed. A palladium catalytic metal layer is present on an interface between the nickel plating film and silicon and an area therearound. The oxygen composition ratio in the palladium catalytic metal layer is low, i.e., about 5 [atom %].

As described above (the related portion in FIG. 10), after the additional process, before the plating step, the step of removing oxide on the surface of the semiconductor substrate may be set. Furthermore, the plating step may be started immediately after the additional process.

Embodiment 3

A semiconductor device manufacturing method according to Embodiment 3 of the present invention includes a step of forming a solid solution of catalytic metal and a semiconductor substrate after a catalytic step and before an oxide removing step. In this step, for example, the semiconductor substrate is kept in a nitrogen atmosphere at 20° C. to 250° C. for 1 to 10 minutes. Alternatively, the semiconductor substrate may be dipped in pure water at about 20° C. to 100° C. for about 1 to 10 minutes. When the semiconductor substrate is GaAs or Si and the catalytic metal is palladium, the semiconductor substrate is merely dipped in pure water at 20° C. to make it possible to form the solid solution. Conditions for forming the solid solution change depending on the materials of the catalytic metal and the semiconductor substrate.

When the step of removing oxygen after the catalytic metal is deposited, the catalytic metal is dissolved by some acid solution to be applied. For example, palladium is dissolved by hydrochloric acid or nitric acid. Thus, in Embodiment 3 of the present invention, after the solid solution of the catalytic metal and the semiconductor substrate is formed, an oxide removing step is performed. When the oxide is to be removed by a wet process, since the solid solution is not easily dissolved in acid treatment, the catalytic metal can be prevented from being dissolved. When the oxide is to be removed by a dry process, since the etching rate of a solid solution is generally lower than the etching rate of an element metal, an amount of lost catalytic metal can be suppressed. The solid solution is formed to make it possible to improve the adhesion between the catalytic metal and the semiconductor substrate.

Figure 12:
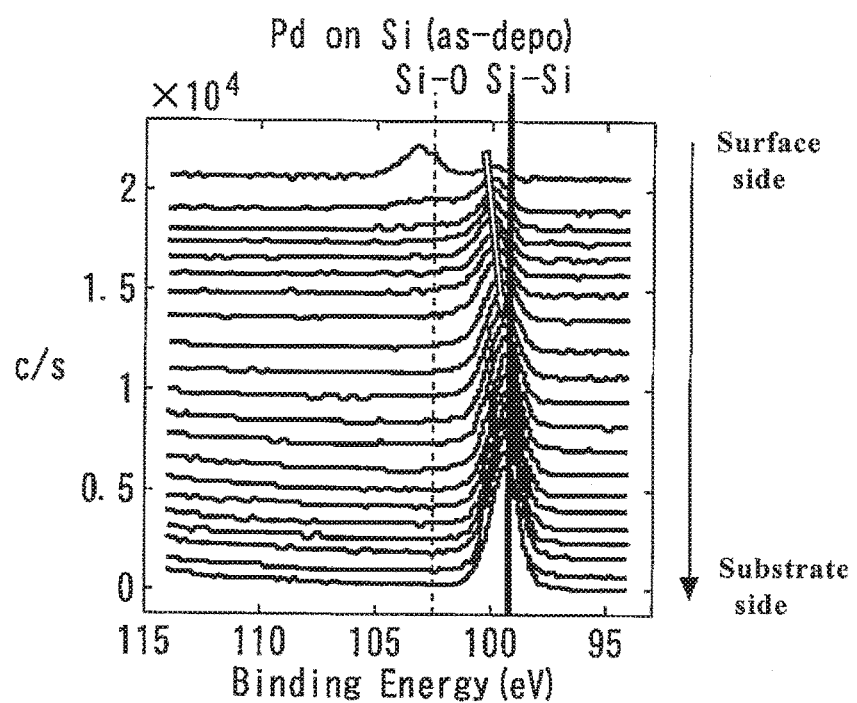
FIG. 12 is a diagram showing an XPS spectrum after Pd deposition.
Figure 13:
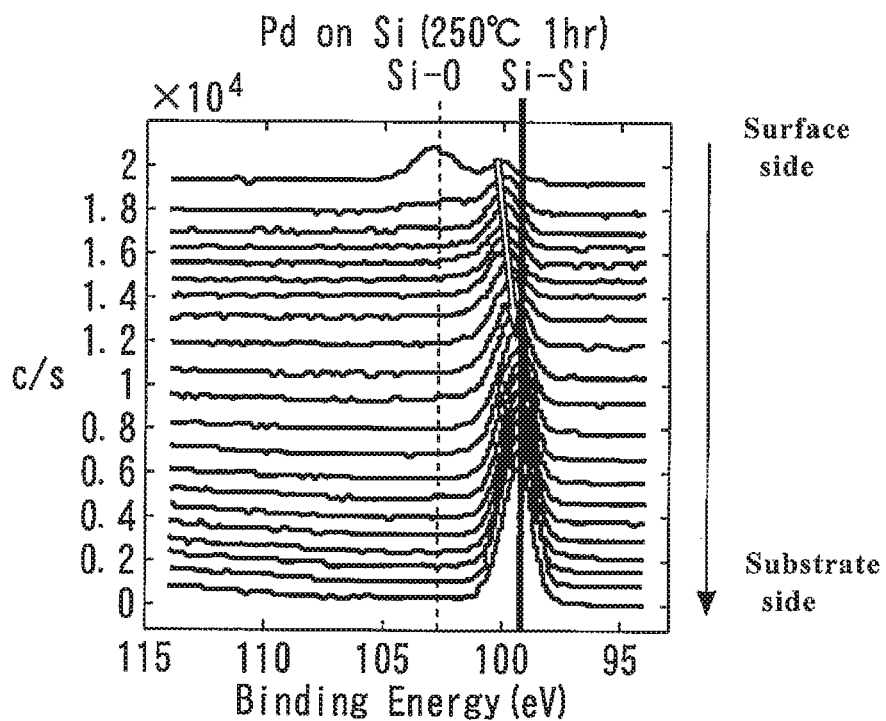
FIG. 13 is a diagram showing an XPS spectrum after Pd deposition.

FIG. 12 and FIG. 13 are graphs showing results obtained by analyzing peak shifts of Si2p orbits in depth XPs with respect to a sample in which palladium (Pd) is deposited on a silicon substrate. Palladium is given by a deposition method to have a thickness of about 5 [nm]. FIG. 12 shows a waveform obtained immediately after palladium is deposited, and FIG. 13 is a waveform obtained after annealing is performed to the sample at 250° C. in a nitrogen atmosphere for 1 hour. In FIGS. 12 and 13, a peak on a sample surface side shifts with respect to a peak on a sample substrate side (peak shift). This shows formation of a solid solution of palladium and silicon. As is apparent from FIG. 12, a solid solution is formed even immediately after palladium is deposited.

Figure 14:
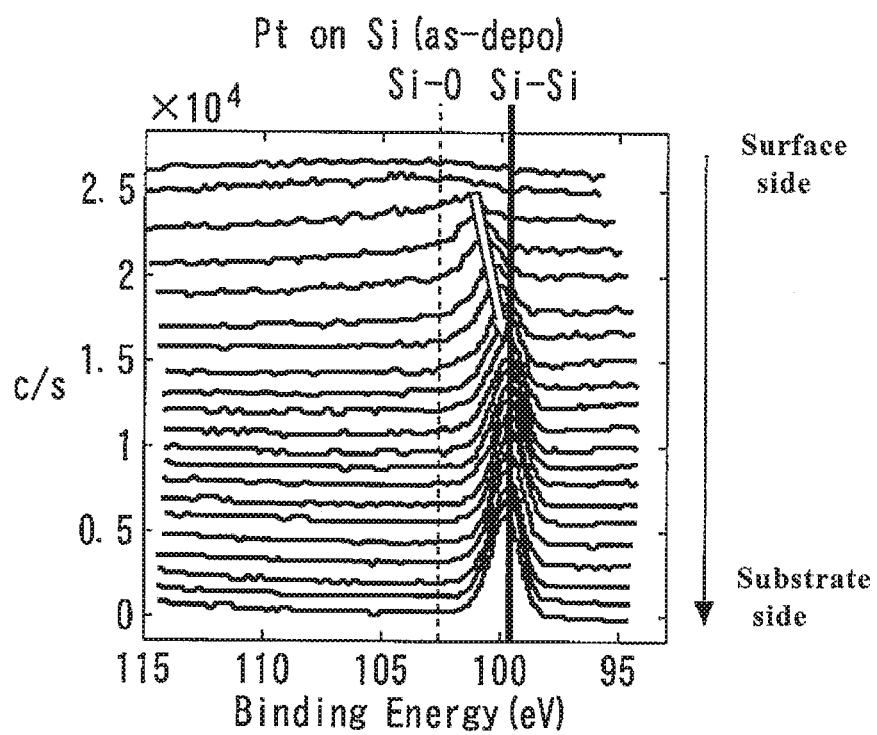
FIG. 14 is a diagram showing an XPS spectrum after Pt deposition.
Figure 15:
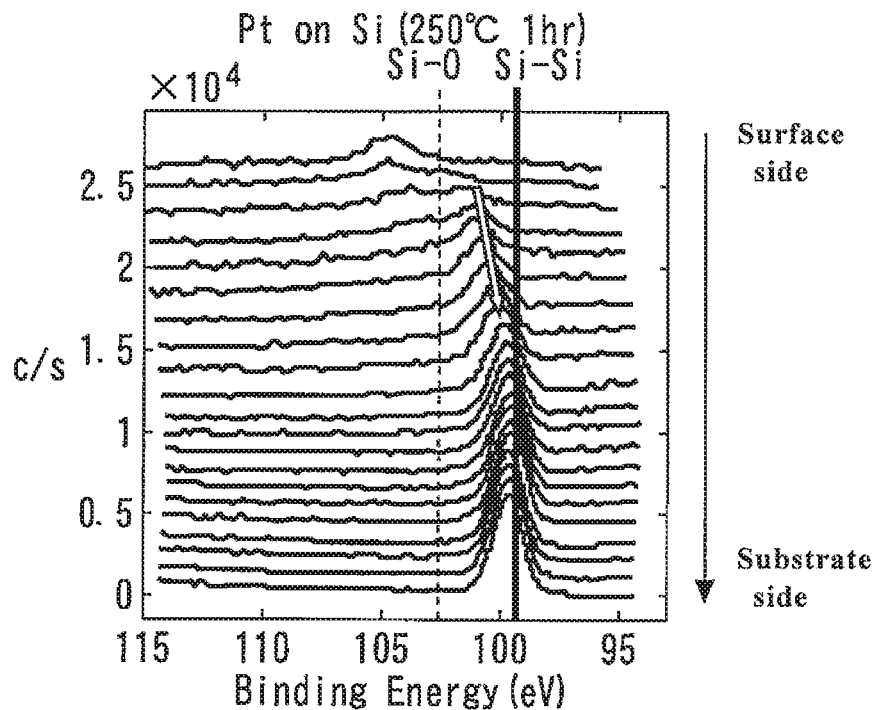
FIG. 15 is a diagram showing an XPS spectrum after Pt deposition.

FIGS. 14 and 15 are graphs showing results obtained by analyzing peak shifts of Si2p orbits in depth XPS with respect to a sample in which platinum (Pt) is deposited on a silicon substrate. Conditions for processing the sample are the same as those in the case described above (FIGS. 12 and 13). With respect to this sample, since a peak shift is observed, it is understood that platinum and silicon form a solid solution.

Figure 16:
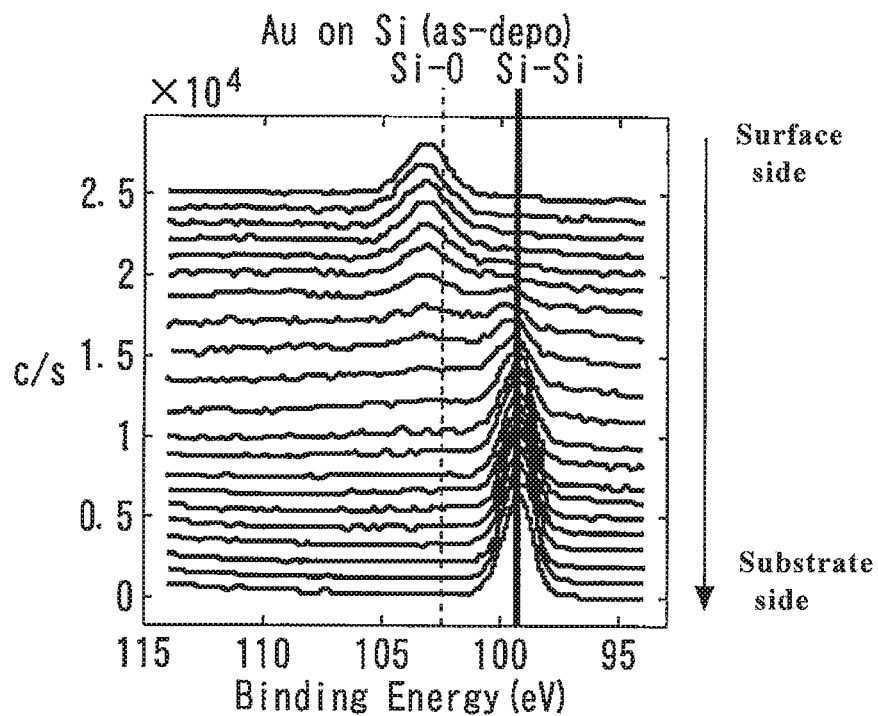
FIG. 16 is a diagram showing an XPS spectrum after Au deposition.
Figure 17:
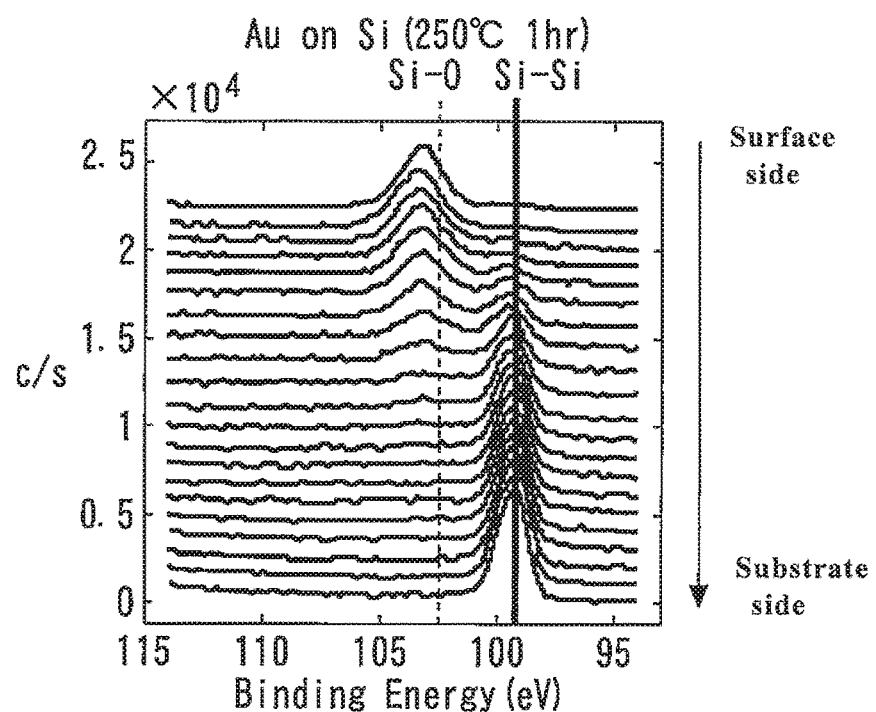
FIG. 17 is a diagram showing an XPS spectrum after Au deposition.

FIGS. 16 and 17 are graphs showing results obtained by analyzing peak shifts of Si2p orbits in depth XPS with respect to a sample in which gold (Au) is deposited on a silicon substrate. Conditions for processing the sample are the same as those in the case described above (FIGS. 12 and 13). With respect to this sample, no peak shift is observed. More specifically, a mixture of the material on the substrate side and the material on the surface side is not observed. Thus, gold and silicon do not form a solid solution.

Figure 18:
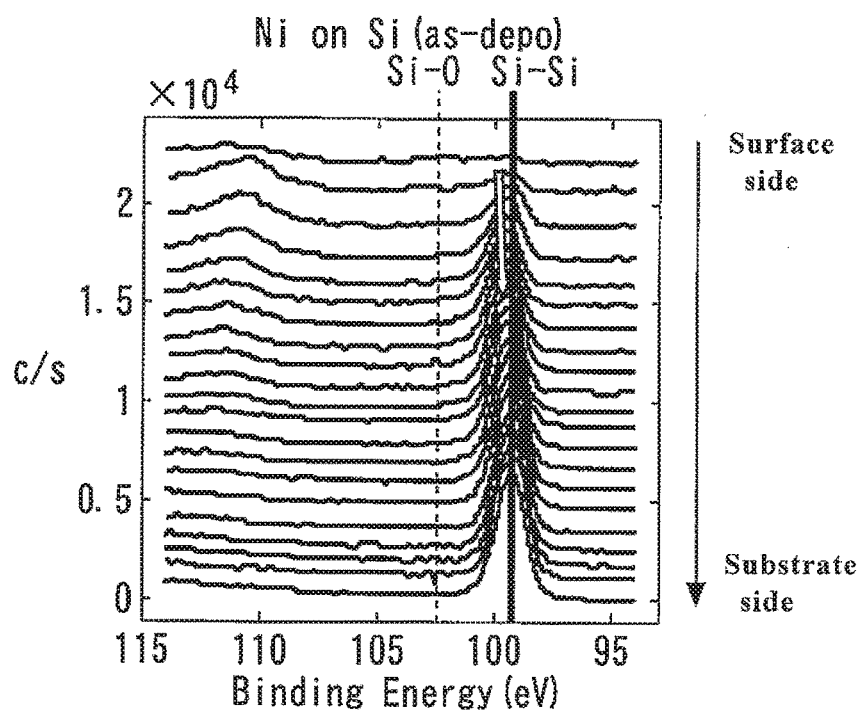
FIG. 18 is a diagram showing an XPS spectrum after Ni deposition.
Figure 19:
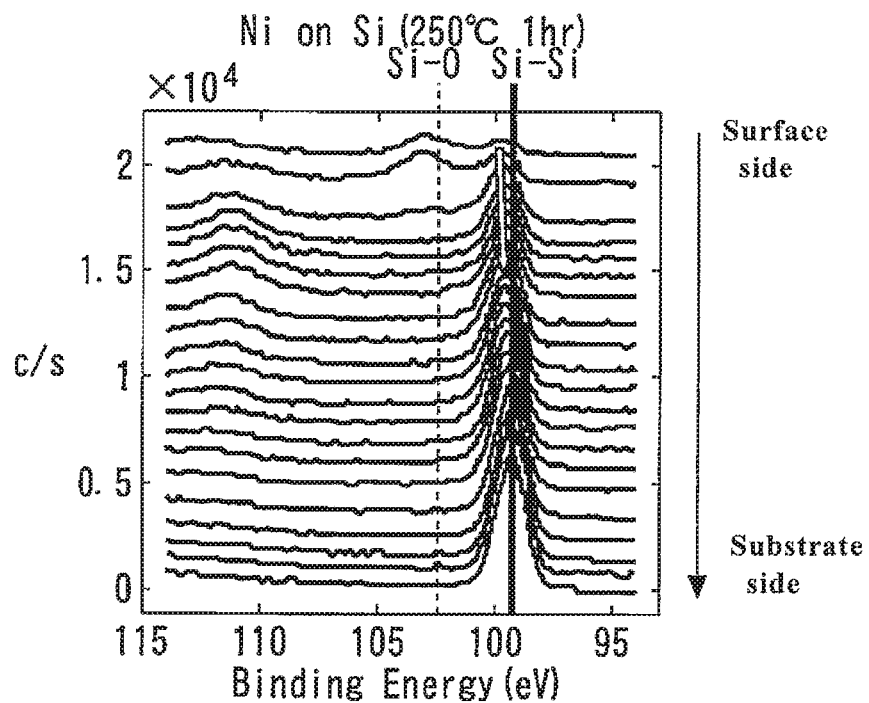
FIG. 19 is a diagram showing an XPS spectrum after Ni deposition.

FIGS. 18 and 19 are graphs showing results obtained by analyzing peak shifts of Si2p orbits in depth XPS with respect to a sample in which nickel (Ni) is deposited on a silicon substrate. Conditions for processing the sample are the same as those in the case described above (FIGS. 12 and 13). Also with respect to this sample, since a peak shift is observed, it is understood that nickel and silicon form a solid solution.

Figure 20:
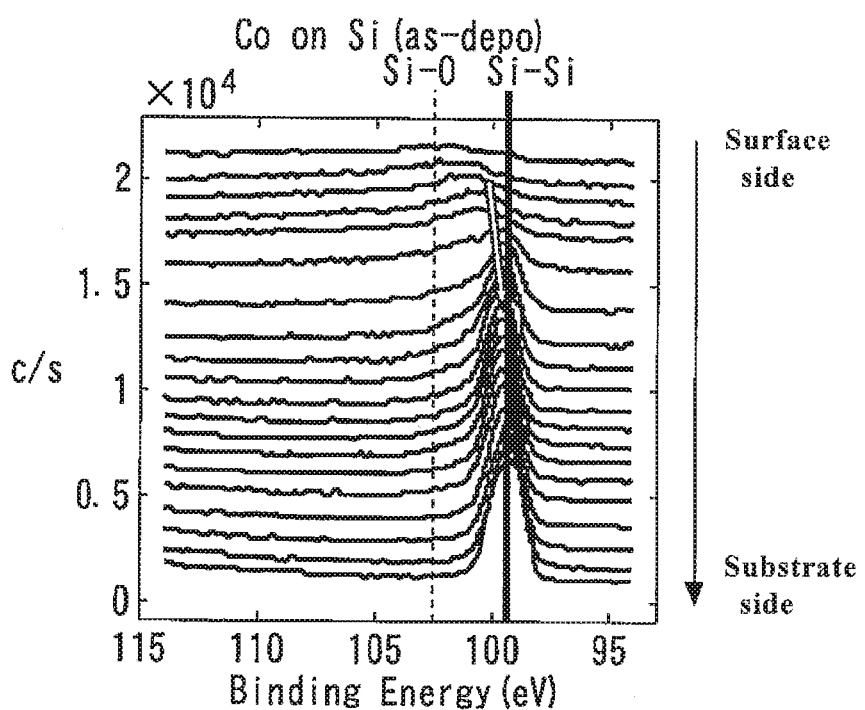
FIG. 20 is a diagram showing an XPS spectrum after Co deposition.

FIGS. 20 and 21 are graphs showing results obtained by analyzing peak shifts of Si2p orbits in depth XPS with respect to a sample in which cobalt (Co) is deposited on a silicon substrate. Conditions for processing the sample are the same as those in the case described above (FIGS. 12 and 13). Also with respect to this sample, since a peak shift is observed, it is understood that cobalt and silicon form a solid solution.

According to the experiments, it is understood that a solid solution of a catalytic metal except for Au and a semiconductor substrate (silicon) can be formed. Thus, when the material of the semiconductor substrate is Si, one or two or more of Pd, Pt, Ni, and Co are preferably used as the catalytic metal.

Catalytic metals which easily form solid solutions together with a semiconductor substrate made of silicon carbide (SiC) were examined by the same manner as described in the experiments described with reference to FIGS. 12 to 21. As a result, when the material of the semiconductor substrate is SiC, it is understood that a solid solution of the semiconductor substrate and the catalytic metal can be formed by using one or two or more of Pd, Au, Ni, and Co as the catalytic metal. FIG. 22 is a table showing whether solid solutions can be formed with respect to combinations of various semiconductor substrates and various catalytic metals.

According to the experiment results in FIGS. 12 to 21, the solid solutions can be formed without performing annealing the samples. However, in order to promote formation of a solid solution, after the catalytic step, before the oxide removing step, a step of forming a solid solution of a catalytic metal and a semiconductor substrate is preferably set. In each of the samples used to obtain the experiment results in FIGS. 12 to 21, since a catalytic metal has an extremely small thickness (about 5 nm) to improve a surface sensitivity, the samples are not suitable for quantitative observation of an amount of formed solid solution.

Embodiment 4

In order to stably form a plating film (metal film) in a plating step, a large number of catalytic metal cores must be formed in a step, such as a catalytic step, of giving a catalytic metal to a semiconductor substrate. The large number of catalytic metal cores are formed to uniformly distribute the catalytic metal on the semiconductor substrate surface.

However, even though the semiconductor substrate is dipped in a catalytic metal solution having a temperature of 25° C. or higher, surface diffusion of the catalyst is promoted not to advance core formation. On the other hand, even though the semiconductor substrate is dipped in a catalytic metal solution having a temperature of lower than 5° C., no catalytic metal is deposited on the substrate. For this reason, in the semiconductor device manufacturing method according to Embodiment 4 of the present invention, in the catalytic step and the additional catalytic step, the semiconductor substrate is dipped in a catalytic metal solution having a temperature of 5° C. or more and 25° C. or less. In this manner, a large number of catalytic metal cores can be formed.

Figure 23:
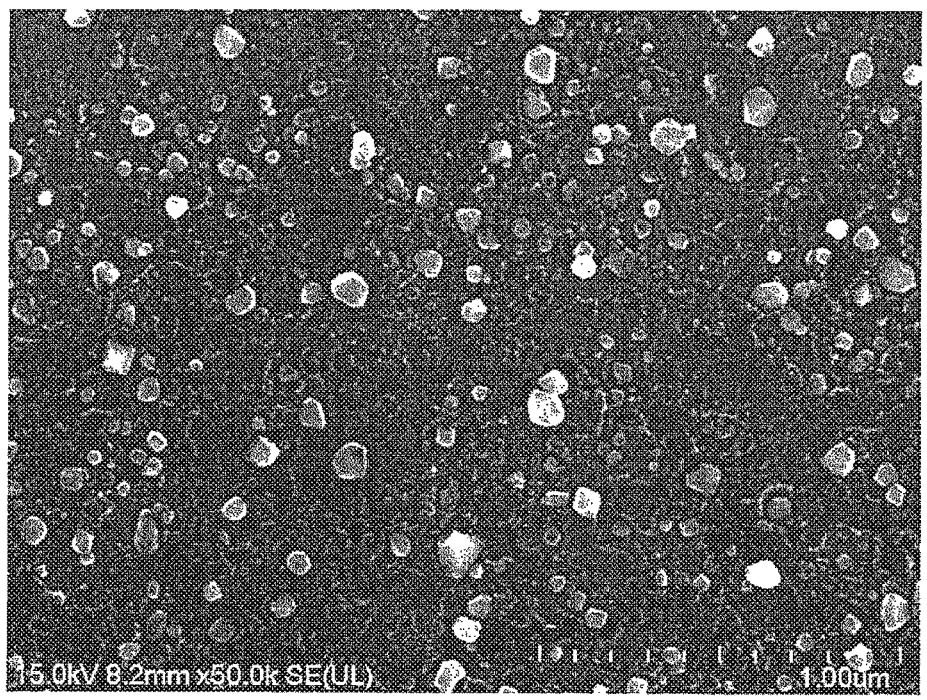
FIG. 23 is an SEM image of a semiconductor substrate surface.
Figure 24:
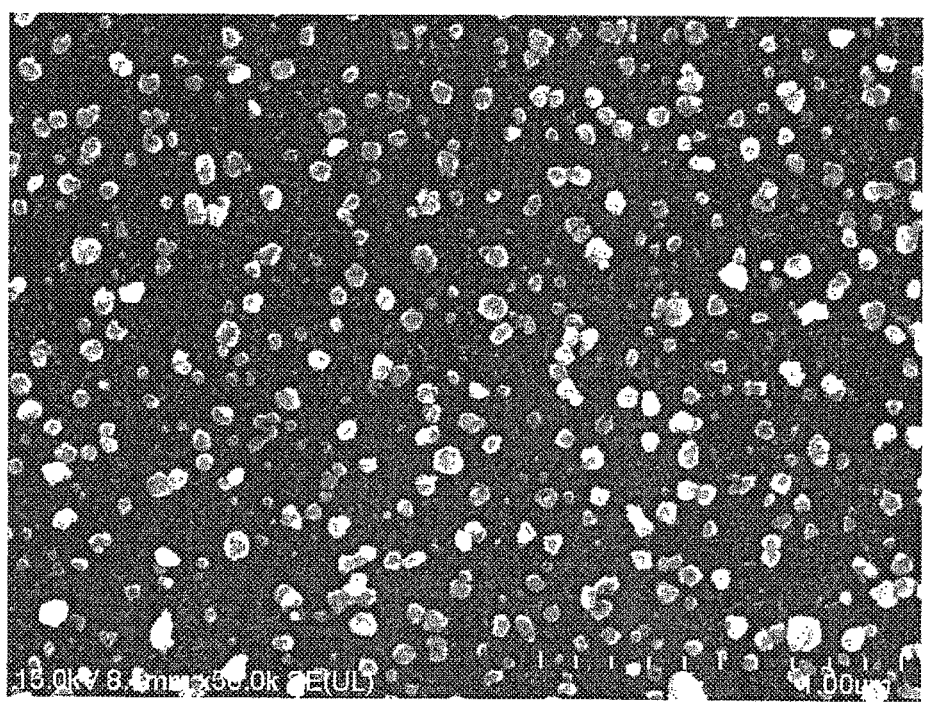
FIG. 24 is an SEM image of a semiconductor substrate surface.

FIG. 23 is an SEM image of a semiconductor substrate surface obtained after a semiconductor substrate is dipped in a catalytic metal solution at 30° C. FIG. 24 is an SEM image of a semiconductor substrate surface obtained after a semiconductor substrate is dipped in a catalytic metal solution at 22° C. The semiconductor substrates of the samples shown in FIGS. 23 and 24 are made of silicon. These samples are formed by being subjected to the same steps as the catalytic step, the oxide removing step, the additional catalytic step, the two additional processes, and the oxide removing step. More specifically, catalysts are given to both the samples four times, respectively. Palladium ion densities of the catalytic metal solution are equal to 0.9 [mmol/L]. Catalysts are given to the sample in FIG. 23 four times by the catalytic metal solution at 30° C., and catalysts are given to the sample in FIG. 24 four times by a catalytic metal solution at 22° C. In removal of oxide, a solution mixture of hydrogen fluoride and ammonium fluoride is used, and a water-washing step using pure water is set between the steps.

In FIGS. 23 and 24, white granular things appearing on surfaces are cores of palladium catalyst. In FIG. 23, a core density is $4E+9/cm^2$, and in FIG. 24, $1E+10/cm^2$. Thus, in order to form a large number of cores of catalytic metal, it is understood that the temperature of the catalytic metal solution is preferably set to 22° C. rather than to 30° C.

The characteristics of the semiconductor device manufacturing methods according to the present embodiments may be arbitrarily combined to each other.

DESCRIPTION OF SYMBOLS

10 semiconductor substrate, 10a upper surface, 12.16.20 catalytic metal, 14 oxide, 30 metal film, 50 catalytic metal, 52 metal film

The invention claimed is:

1. A semiconductor device manufacturing method comprising:
    a catalytic step of depositing catalytic metal on a surface of a semiconductor substrate, the catalytic metal deposition subjecting the surface of the semiconductor substrate to oxidation;
    an oxide removing step of removing oxide formed on the surface of the semiconductor substrate in the catalytic step;
    an additional catalytic step of depositing catalytic metal on the surface of the semiconductor substrate exposed in the oxide removing step; and
    a plating step of forming a metal film on the surface of the semiconductor substrate by means of an electroless plating method after the additional catalytic step.

2. The semiconductor device manufacturing method according to claim 1, comprising the step of removing the oxide formed on the surface of the semiconductor substrate in the additional catalytic step before the plating step.

3. The semiconductor device manufacturing method according to claim 1, wherein an additional process of, after the additional catalytic step and before the plating step, removing the oxide on the surface of the semiconductor substrate and depositing catalytic metal on the surface of the semiconductor substrate thereafter is performed once or more.

4. The semiconductor device manufacturing method according to claim 3, comprising the step of removing the oxide on the surface of the semiconductor substrate after the additional process and before the plating method.

5. The semiconductor device manufacturing method according to claim 1, comprising
    the step of forming a solid solution of the catalytic metal and the semiconductor substrate after the catalytic step and before the oxide removing step.

6. The semiconductor device manufacturing method according to claim 5,
    wherein a material of the semiconductor substrate is Si, and
    as the catalytic metal, one or two or more of Pd, Pt, Ni, and Co are used.

7. The semiconductor device manufacturing method according to claim 5,
    wherein a material of the semiconductor substrate is SiC, and
    as the catalytic metal, one or two or more of Pd, Au, Ni, and Co are used.

8. The semiconductor device manufacturing method according to claim 1, wherein
    in the catalytic step and the additional catalytic step, the semiconductor substrate is dipped in a catalytic metal solution being free from a hydrofluoric-acid-based solution.

9. The semiconductor device manufacturing method according to claim 1, wherein
    the oxide is removed by using a hydrofluoric-acid-based solution.

10. The semiconductor device manufacturing method according to claim 1, wherein
    in the catalytic step and the additional catalytic step, the semiconductor substrate is dipped in a catalytic metal solution at 5° C. or higher and 25° C. or lower.

* * * * *